US010546899B2

(12) United States Patent
Maeda

(10) Patent No.: US 10,546,899 B2
(45) Date of Patent: Jan. 28, 2020

(54) METHOD OF MANUFACTURING AN ORGANIC EL DISPLAY DEVICE

(71) Applicant: Japan Display Inc., Minato-ku (JP)

(72) Inventor: Norihisa Maeda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/794,036

(22) Filed: Oct. 26, 2017

(65) Prior Publication Data

US 2018/0138248 A1 May 17, 2018

(30) Foreign Application Priority Data

Nov. 17, 2016 (JP) ................................. 2016-224405

(51) Int. Cl.
*G09G 3/30* (2006.01)
*H01L 27/32* (2006.01)
*H05B 33/10* (2006.01)
*H01L 51/52* (2006.01)
*H01L 51/50* (2006.01)

(52) U.S. Cl.
CPC ...... *H01L 27/3211* (2013.01); *H01L 51/5012* (2013.01); *H01L 51/5206* (2013.01); *H01L 51/5253* (2013.01); *H05B 33/10* (2013.01); *H01L 27/3246* (2013.01); *H01L 2251/301* (2013.01); *H01L 2251/558* (2013.01); *H01L 2251/566* (2013.01)

(58) Field of Classification Search
None
See application file for complete search history.

(56) References Cited

U.S. PATENT DOCUMENTS

| 2002/0180349 A1* | 12/2002 | Aziz | H01L 51/5221 313/506 |
| 2005/0110398 A1* | 5/2005 | Lee | H01L 27/3211 313/504 |
| 2010/0053043 A1* | 3/2010 | Sakamoto | H01L 27/3213 345/77 |
| 2010/0053044 A1* | 3/2010 | Lee | H01L 51/5265 345/80 |

FOREIGN PATENT DOCUMENTS

| JP | 2010-165587 | 7/2010 |
| JP | 2013-058323 | 3/2013 |

* cited by examiner

*Primary Examiner* — Carl Adams
(74) *Attorney, Agent, or Firm* — Oblon, McClelland, Maier & Neustadt, L.L.P.

(57) ABSTRACT

A manufacturing method of an organic EL display device including a plurality of subpixels where light emitting layers that emit first to third lights are formed, includes forming a reflective film that reflects light, forming a lower electrode that has conductivity and light transmitting characteristics, a first process where, in the subpixels where the light emitting layers that emit the first and second lights are formed, a part of an optical path length adjusting layer is formed at the same time, a second process where, in the subpixels where the light emitting layers that emit the first and third lights are formed, another part of the optical path length adjusting layer is formed at the same time so as to set its thickness different from that of the one formed in the first process, and forming an upper electrode having conductivity, light transmitting characteristics, and reflective characteristics.

14 Claims, 5 Drawing Sheets

METHOD OF MANUFACTURING AN ORGANIC EL DISPLAY DEVICE

CROSS-REFERENCE TO RELATED APPLICATION

The present application claims priority from Japanese Application JP2016-224405 filed on Nov. 17, 2016, the content of which is hereby incorporated by reference into this application.

BACK GROUND OF THE INVENTION

1. Field of the Invention

One or more embodiments of the present invention relate to a manufacturing method of an organic EL display device.

2. Description of the Related Art

Recent years, an organic EL display device using an organic EL element is put into practical use, and technological developments regarding manufacturing technologies are proceeded.

For example, Japanese Patent Application Laid-Open No. 2013-058323 and Japanese Patent Application Laid-Open No. 2010-165587 disclose forming a light emitting layer without increasing a number of times vapor depositions are carried out and without lowering a strength of a mask, by a manufacturing technology to dispose subpixels that emit light in the same color, from among subpixels included in neighboring pixels, adjacent to one another.

SUMMARY OF THE INVENTION

As described in Japanese Patent Application Laid-Open No. 2013-058323 and Japanese Patent Application Laid-Open No. 2010-165587 as above, as to an organic EL display device where light emitting layers of respective subpixels included in one pixel emit lights in different colors, in order to improve luminance, path lengths of the respective subpixels need to be optimized. In particular, a distance between the light emitting layer and a reflective film is important. Respective layers between the light emitting layer and the reflective film formed to optimize the distance are generally formed using a fine mask.

However, the vaper deposition method using a fine mask produces wastes, as materials deposit on a part where no opening is formed are wasted. Due to such wastes, necessary raw materials increase, and the manufacturing cost arises.

For example, FIG. 6 is a diagram that schematically illustrates respective layers within one pixel formed between a reflective film 308 and an upper electrode 316 according to the prior art. As illustrated in FIG. 6, starting from the reflective film 308 toward the upper electrode 316, the reflective film 308, a lower electrode 310, a hole injection layer 400, hole transport layers 402, 404, and 406, light emitting layers 408, 410, and 412, a hole block layer 414, an electron transport layer 416, and the upper electrode 316 are laminated in order.

The light emitting layers are formed to include a red light emitting layer 408 that emits red light, a green light emitting layer 410 that emits green light, and a blue light emitting layer 412 that emits blue light. Further, the hole transport layers are formed to include a first hole transport layer 402 formed under all of the red light emitting layer 408, the green light emitting layer 410, and the blue light emitting layer 412, a second hole transport layer 404 formed only under the red light emitting layer 408, and a third hole transport layer 406 formed only under the green light emitting layer 410.

In order to optimize the optical path lengths of lights emitted by the respective light emitting layers 408, 410, and 412, the thicknesses of the first hole transport layer 402, the second hole transport layer 404, and the third hole transport layer 406 are optimized. Specifically, for example, the total thickness of the first hole transport layer 402 and the second hole transport layer 404 formed under the red light emitting layer 408 is set in accordance with a wavelength of the red light. Similarly, the total thickness of the first hole transport layer 402 and the third hole transport layer 406 formed under the green light emitting layer 410 is set in accordance with a wavelength of the green light. Further, the thickness of the first hole transport layer 402 formed under the blue light emitting layer 412 is set in accordance with a wavelength of the blue light.

For example, in the prior art of FIG. 6, the first hole transport layer 402 is formed to have a thickness of 100 nm. Further, the second hole transport layer 404 is formed to have a thickness of 70 nm. Further, the third hole transport layer 406 is formed to have a thickness of 35 nm.

Here, the first hole transport layer 402, the second hole transport layer 404, and the third hole transport layer 406 need to be formed in different processes respectively. Therefore, in the processes to form the first hole transport layer 402, the second hole transport layer 404, and the third hole transport layer 406, materials of the hole transport layers are consumed as much as the amount to form the hole transport layers that have a total thickness of 205 nm. This consumption amount is large with respect to the thickness of the formed hole transport layers, and thus wastes are produced.

Particularly, in the process of forming the first hole transport layer 402 and the second hole transport layer 404, subpixels other than the subpixels corresponding thereto are covered by a mask, the material of the hole transport layer attached to the mask is disposed of, which is wasting.

The present invention has been made in view of the above issue, and the object thereof is to suppress a consumption amount of a material at a manufacturing process of an organic EL display device, to thereby provide a manufacturing method of an organic EL display device as to which the consumption cost is reduced.

According to one aspect of the present invention, a manufacturing method of an organic EL display device including a plurality of subpixels where light emitting layers that emit first to third lights whose wavelengths are different from one another are formed, includes forming a reflective film that reflects light, forming a lower electrode that has conductivity and light transmitting characteristics, a first process where, in the subpixels where the light emitting layers that emit the first and second lights are formed, a part of an optical path length adjusting layer is formed at the same time, a second process where, in the subpixels where the light emitting layers that emit the first and third lights are formed, another part of the optical path length adjusting layer is formed at the same time so as to set its thickness different from that of the one formed in the first process, and forming an upper electrode having conductivity, light transmitting characteristics, and reflective characteristics.

In one embodiment of the present invention, the manufacturing method of an organic EL display device further includes a third process where, in the subpixels where the light emitting layers that emit the first to third lights are formed, still another part of the optical path length adjusting layer is formed at the same time.

In one embodiment of the present invention, a microcavity structure is formed so that light having a wavelength that corresponds to the thickness of the optical path length adjusting layer formed through the first to third processes resonates between the reflective film and the upper electrode.

In one embodiment of the present invention, the optical path length adjusting layer comprises a hole transport layer.

In one embodiment of the present invention, among the first to third lights, the first light has the longest wavelength, and the third light has the shortest wavelength.

In one embodiment of the present invention, in the first to third processes, the optical path length adjusting layer is formed using a fine mask.

According to another aspect of the present invention, a manufacturing method of an organic EL display device includes a first subpixel that is provided with a light emitting layer of a first color, a second subpixel this is adjacent to the first subpixel and is provided with a light emitting layer of a second color, and a third subpixel this is adjacent to the first subpixel on a side of the first subpixel opposite to a side where the second subpixel is located and is provided with a light emitting layer of a third color. The manufacturing method of an organic EL display device includes a lower electrode formation process where a first lower electrode of the first subpixel, a second lower electrode of the second subpixel, and a third lower electrode of the third subpixel are formed, a first charge transport layer formation process where a first charge transport layer is formed on the first lower electrode, the second lower electrode, and the third lower electrode, a light emitting layer formation process where the light emitting layer of the first color, the light emitting layer of the second color, and the light emitting layer of the third color are formed on the first charge transport layer, a second charge transport layer formation process where a second charge transport layer is formed that covers the light emitting layer of the first color, the light emitting layer of the second color, and the light emitting layer of the third color, and an upper electrode formation process where an upper electrode is formed on the second charge transport layer. The first charge transport layer formation process comprises a third charge transport layer formation process where a third charge transport layer that exists across the first subpixel and the second subpixel is formed in a lump, and a fourth charge transport layer formation process where a fourth charge transport layer that exists across the first subpixel and the third subpixel and is on the third charge transport layer in the first subpixel is formed in a lump.

In one embodiment of the present invention, a thickness of the third charge transport layer is different from a thickness of the fourth charge transport layer.

In one embodiment of the present invention, the first charge transport layer, the third charge transport layer, and the fourth charge transport layer are hole transport layers. The second charge transport layer is an electron transport layer. In one embodiment of the present invention, the first charge transport layer formation process includes a fifth charge transport layer formation process (to be carried out before the third charge transport layer formation process and the fourth charge transport layer formation process) where a fifth charge transport layer that exists across the first subpixel, the second subpixel, and the third subpixel is formed in a lump.

In one embodiment of the present invention, the fifth charge transport layer is a hole transport layer.

In one embodiment of the present invention, the manufacturing method of an organic EL display device further includes a first charge injection layer formation process where a first charge injection layer is formed that covers the first lower electrode, the second lower electrode, and the third lower electrode, between the lower electrode formation process and the first charge transport layer formation process and a second charge injection layer formation process where a second charge injection layer is formed on the second charge transport layer, between the second charge transport layer formation process and the upper electrode formation process.

In one embodiment of the present invention, a thickness of the first charge transport layer in the first subpixel, a thickness of the first charge transport layer in the second subpixel, and a thickness of the first charge transport layer in the third subpixel are different from one another.

In one embodiment of the present invention, the manufacturing method of an organic EL display device further includes a reflective electrode formation process where a first reflective electrode, a second reflective electrode, and a third reflective electrode are formed before the lower electrode formation process. The first lower electrode is indirect contact with the first reflective electrode. The second lower electrode is in direct contact with the second reflective electrode. The third lower electrode is in direct contact with the third reflective electrode.

DETAILED DESCRIPTION OF THE INVENTION

Figure 1:
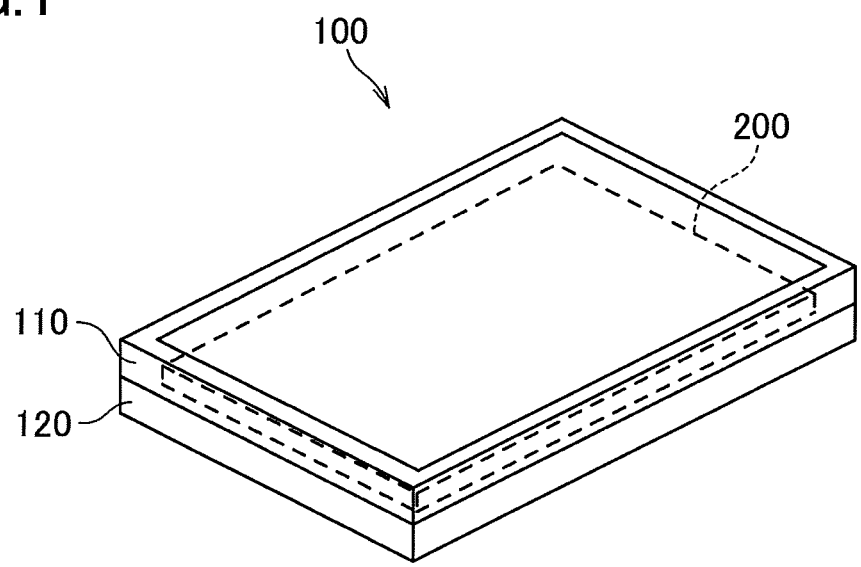
FIG. 1 is a diagram that schematically illustrates an organic EL display device according to an embodiment of the present invention.

Below, respective embodiments of the present invention are explained with reference to the accompanying drawings. Note that disclosed embodiments are merely examples, and an appropriate variation that a person skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

FIG. 1 is a diagram that schematically illustrates an organic EL display device 100 according to an embodiment of the present invention. As illustrated in the figure, the organic EL display device 100 is composed of a display panel 200 that is fixed so as to be sandwiched by an upper frame 110 and a lower frame 120.

Figure 2:
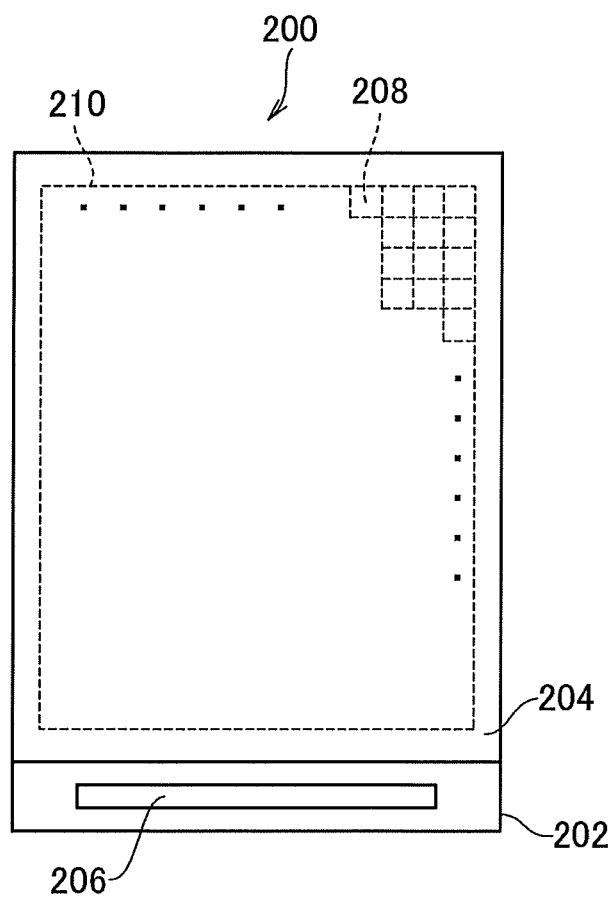
FIG. 2 is a diagram that schematically illustrates a display panel.

FIG. 2 is a diagram that schematically illustrates the display panel 200 of FIG. 1. The display panel 200 includes an array substrate 202, a protective film 204, and a driver IC (Integrated Circuit) 206.

Further, the display panel 200 includes pixels 208 that are arranged in a matrix on the display region 210. A pixel 208 is composed of a plurality of subpixels. Specifically, the display panel 200 includes a plurality of subpixels where light emitting layers 408, 410, and 412 (see FIG. 4) are formed that emit first to third lights whose wavelengths are different from one another.

On the array substrate 202, the light emitting layers 408, 410, and 412, hole transport layers, and the like are formed.

The driver IC 206, for example, applies an electric potential for electrically connects the source and the drain to the driving transistor 304 arranged in each subpixel, and also applies and electric current that corresponds to a gradation value of the subpixel to each data signal line. By the driver IC 206, the display panel 200 displays, in the display region 210, a color image constituted by a plurality of pixels 208 each of which is constituted by a plurality of colors.

The protective film 204 is a film made of acryl to protect the display panel 200 from an external damage, and is bonded to the array substrate 202 by adhesive.

Figure 3:
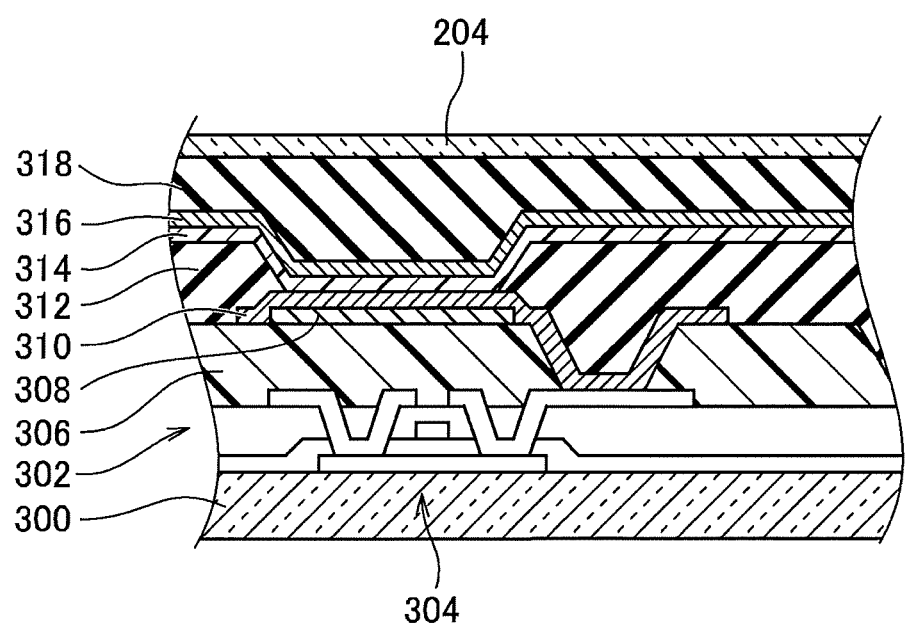
FIG. 3 is an example that schematically illustrates a lamination structure of a cross section of the display panel.

FIG. 3 is a diagram that schematically illustrates a cross section of the display panel 200. As illustrated in the figure, the display panel 200 is configured to include, from the bottom toward the top in the figure, a substrate 300, an array layer 302, a planarizing film 306, the reflective film 308, the lower electrode 310, a rib 312, an organic EL layer 314, the upper electrode 316, a sealing film 318, and the protective film 204 described above, in order.

The substrate 300 is, for example, a glass substrate, but it may be a substrate that is formed of resin, and has a flexibility.

The array layer 302 is formed on the substrate 300. Specifically, the array layer 302 is formed on the substrate 300 so as to include a plurality of transistors 304 configured to include a source electrode, a drain electrode, a gate electrode, a semiconductor layer, and the like.

The planarizing film 306 is formed of an insulating material on the array layer 302. Specifically, the planarizing film 306 is formed of the insulating material so as to provide a through hole over either the source electrode or the drain electrode of the driving transistor 304, and cover the array layer 302 in a region other than the region where the through hole is formed.

The reflective film 308 is formed of a material that reflects light emitted from the organic EL layer 314, on the planarizing film 306. Specifically, for example, the reflective film 308 is formed of Ag.

The lower electrode 310 is formed on the reflective film 308 and the planarizing film 306. Specifically, the lower electrode 310 is formed of a material that is transparent and conductive such as ITO, so as to cover the reflective film 308 and so as to be electrically connected to the source electrode or the drain electrode of the driving transistor 304 via the through hole. It may be configured also that the lower electrode 310 is formed of metal, and the lower electrode 310 functions also as the reflective film 308, that is, the reflective film 308 is omitted.

The rib 312 is formed on the lower electrode 310. Specifically, the rib 312 is formed so as to cover the planarizing film 306 in the region where the lower electrode 310 is not formed and so as to be formed on the lower electrode 310 in the region where the lower electrode 310 is formed. Further, the rib 312 is formed so as to have a rib opening part on the upper layer side of the region where the reflective film 308 is formed. The rib opening part is a region where light goes out from the display panel 200.

The organic EL layer 314 is configured to include the light emitting layers 408, 410, and 412 that emit light, the hole transport layers, and the like. The detail of the organic EL layer 314 will be described later.

The upper electrode 316 is formed on the organic EL layer 314. Specifically, the upper electrode 316 is formed of a material having conductivity together with a light transmitting character and a light reflecting character (called a transflective character also) so as to cover the organic EL layer 314. The upper electrode 316 is formed of, for example, an alloy of Mg and Ag. The upper electrode 316 supplies electrons to the organic EL layer 314, and thereby makes the organic EL layer 314 emit light, together with holes supplied from the lower electrode 310 to the organic EL layer 314.

The sealing film 318 is formed on the upper electrode 316. Specifically, the sealing film 318 is formed of an inorganic material that does not transmit moisture, so as to cover the upper electrode 316. The sealing film 318 prevents a degeneration of the organic EL layer 314 due to an intrusion of moisture into the organic EL layer 314.

Figure 4:
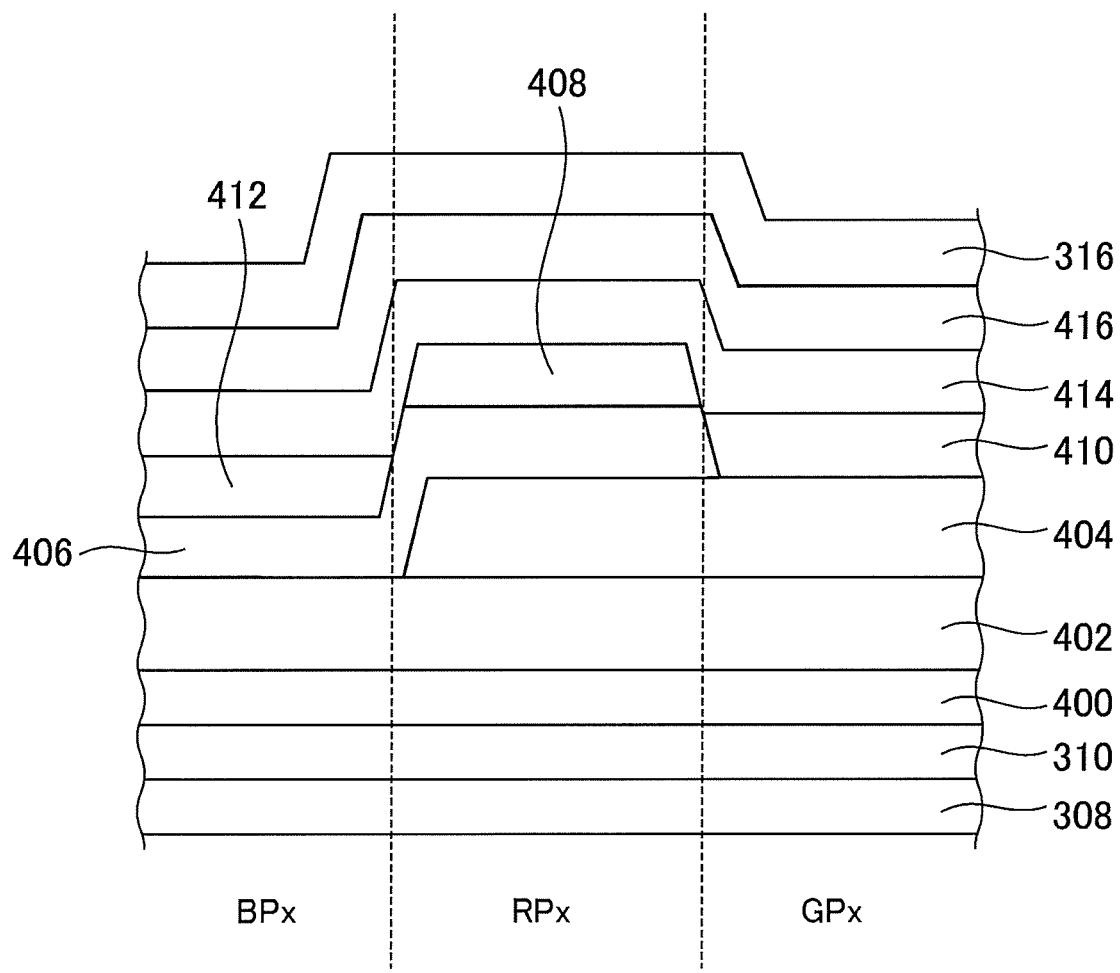
FIG. 4 is a diagram that schematically illustrates respective layers formed between a reflective film and an upper electrode in one pixel.

Subsequently, the detail of the organic EL layer 314 is explained with reference to FIG. 4. FIG. 4 is a diagram that schematically illustrates the respective layers formed between the reflective film 308 and the upper electrode 316 in one pixel 208. As illustrated in FIG. 4, the organic EL layer 314 is constituted by a lamination of the hole injection layer 400, the hole transport layers 402, 404, and 406, the light emitting layers 408, 410, and 412, the hole block layer 414, and the electron transport layer 416.

Note that FIG. 4 is a schematic diagram, and the lower electrode 310 is seamlessly illustrated across a blue subpixel (BPx), a red subpixel (RPx), and a green subpixel (GPx), but the lower electrode 310 is configured to include a first lower electrode of the red subpixel (RPx), a second lower electrode of the green subpixel (GPx), and a third lower electrode of the blue subpixel (BPx). Further, the hole transport layer and the electron transport layer are called a charge transport layer also. As to the language of the claims, the first charge transport layer corresponds to the hole transport layer, and the second charge transport layer corresponds to the electron transport layer.

The hole injection layer 400 is formed on the lower electrode 310. Specifically, the hole injection layer 400 is formed on the lower electrode 310 across subpixels where the light emitting layers 408, 410, and 412 that emit the first to third lights are formed. Here, the first to third lights are lights that are emitted from the respective subpixels that constitute one pixel. The first light has the longest wavelength, and the third light has the shortest wavelength.

For example, the hole injection layer 400 is formed on the lower electrode 310 across the red subpixel (RPx) for emitting red light that is the first light, the green subpixel (GPx) for emitting green light that is the second light, and the blue subpixel (BPx) for emitting blue light that is the third light. FIG. 4 schematically illustrates the configuration where the blue subpixel (BPx), the red subpixel (RPx), and the green subpixel (GPx) are disposed, from the left in order.

Further, the hole injection layer 400 is formed using a material that has a function to supply holes injected from the lower electrode 310 to the hole transport layers. For example, the hole injection layer 400 is, in order to reduce a hole injection barrier, formed using a material with a HOMO energy level that differs slightly from a Fermi level of the material used for the lower electrode 310.

The hole transport layers are formed to include the first hole transport layer 402, the second hole transport layer 404, and the third hole transport layer 406. Specifically, the first hole transport layer 402 is formed to have a thickness of 65 nm on the hole injection layer 400 across all of the regions of the red subpixel, the green subpixel, and the blue subpixel. The second hole transport layer 404 is formed to have a thickness of 70 nm on the first hole transport layer 402 in the red subpixel and the green subpixel. The third hole transport layer 406 is formed to have a thickness of 35 nm on the second hole transport layer 404 in the red subpixel, and on the first hole transport layer 402 in the blue subpixel.

According to the above configuration, the hole transport layers 402, 404, and 406 having a total thickness of 170 nm are formed in the red subpixel. Further, the hole transport layers 402 and 404 having a total thickness of 135 nm are formed in the green subpixel. Moreover, the hole transport layers 402 and 406 having a total thickness of 100 nm are formed in the blue subpixel. Due to this configuration, the microcavity structure is formed by setting the thicknesses of the hole transport layers differently at each subpixel.

Further, the hole transport layers are formed using a material that has a function to supply the holes supplied from the hole injection layer 400 to the light emitting layers 408, 410, and 412. For example, it is desirable that the hole transport layers are formed of a material having a HOMO energy level that is slightly different from a HOMO energy level of the hole injection layer 400.

The organic EL layer is formed to include the light emitting layers 408, 410, and 412 that emit the first to third lights. Specifically, the organic EL layer is formed to include the red light emitting layer 408 that emits red light, the green light emitting layer 410 that emits green light, and the blue light emitting layer 412 that emits blue light.

Further, the red light emitting layer 408 is formed on the third hole transport layer 406 in the red subpixel. The green light emitting layer 410 is formed on the second hole transport layer 404 in the green subpixel. The blue light emitting layer 412 is formed on the third hole transport layer 406 in the blue subpixel.

The hole block layer 414 is formed on the light emitting layers 408, 410, and 412. Specifically, the hole block layer 414 is formed, on the respective light emitting layers 408, 410, and 412, of a material having a function to prevent the holes supplied from the hole transport layers 402, 404, and 406 to the light emitting layers 408, 410, and 412 from reaching the electron transport layer 416.

The electron transport layer 416 is formed on the hole block layer 414. Specifically, the electron transport layer 416 is formed, on the hole block layer 414, of a material having a function to supply the electrons supplied from the upper electrode 316 to the light emitting layers 408, 410, and 412.

Due to the above configuration, a part of light emitted from the light emitting layers 408, 410, and 412 is reflected more than once between the upper electrode 316 formed of, for example, an alloy of Mg and Ag, and the reflective film 308 formed of, for example, Ag. Therefore, it can be said that the various types of layers positioned between the reflective film 308 and the upper electrode 316 described above adjust the optical path length. The luminance of the display 200 can be improved by forming the microcavity structure so that light having the wavelength corresponding to the optical path length resonates between the reflective film 308 and the upper electrode 316.

Note that the light having the wavelength corresponding to the optical path length is light having such a wavelength that its intensity can be strengthened, for example, through more than one reflections between the reflective film 308 and the upper electrode 316. Here, since the hole injection layer 400 and the hole transport layers are, in the structure described later, layers whose optical path length is adjusted for the respective colors of the subpixels in accordance with the wavelength of the respective colors, the hole injection layer 400 and the hole transport layers are referred to as an optical path length adjusting layer.

The configuration of the organic EL layer 314 is not limited to the above embodiment, and various types of variations are possible. For example, the hole block layer 414 may be omitted, and the electron injection layer may be disposed on the electron transport layer 416.

For example, considering the characteristics of the hole transport layers and the hole injection layer 400 described above, it is common to use, for the hole transport layers, a material having an electric resistance smaller than that of the hole injection layer 400. Therefore, it is preferable to control the distance between the reflective film 308 and the upper electrode 316 (i.e., the optical path length) by the hole transport layers, as in the above embodiment. In this case, the microcavity structure is formed by differentiating the thicknesses of the hole transport layers included in the optical path length adjusting layer for each subpixel. However, a microcavity structure the same as the above one may be formed also by differentiating the thickness of the hole injection layer 400 for each subpixel.

Figure 5:
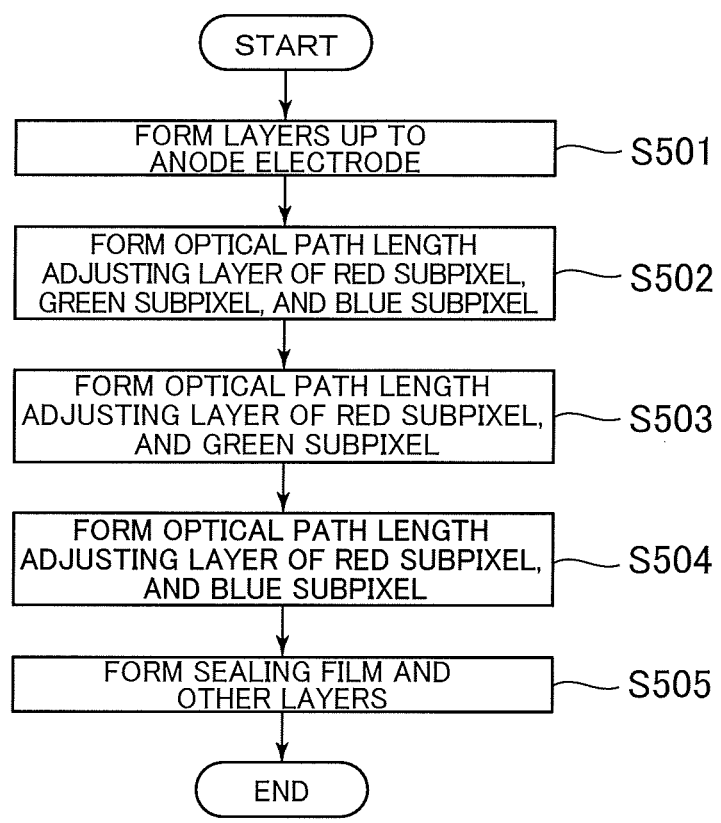
FIG. 5 is a flowchart that explains a manufacturing process.
Figure 6:
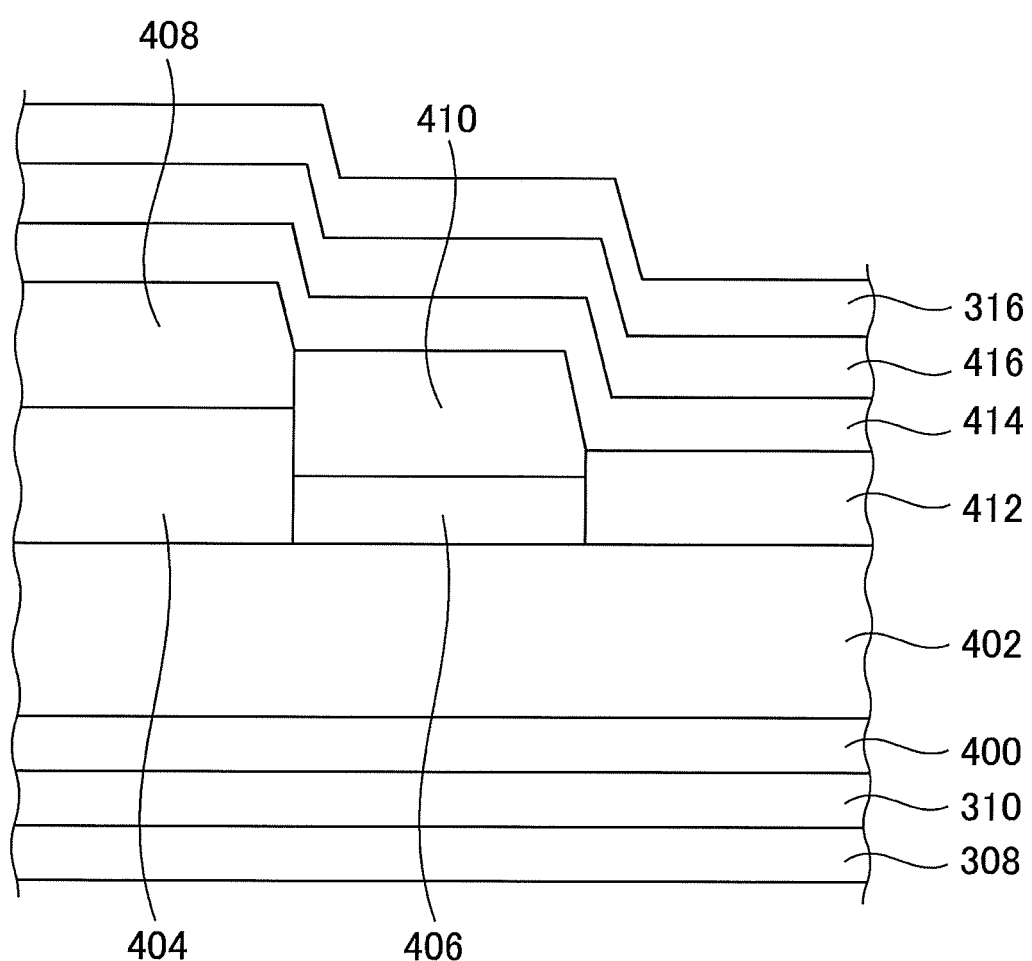
FIG. 6 is a diagram that schematically illustrates respective layers formed between a reflective film and an upper electrode in one pixel according to the prior art.

Subsequently, a manufacturing method of the display panel 200 in the present embodiment is explained. FIG. 5 is a flowchart illustrating the manufacturing method of the display panel 200 in the present embodiment.

First, on the substrate 300, the lower electrode 310 and the layers thereunder are formed (S501). Specifically, before the formation process of the lower electrode 310, the reflective film 308 including a first reflective electrode, a second reflective electrode, and a third reflective electrode is formed. Here, the first lower electrode is formed to be in direct contact with the first reflective electrode, the second lower electrode is formed to be in direct contact with the second reflective electrode, and the third lower electrode is formed to be in direct contact with the third reflective electrode.

Next, a lower electrode formation process to form the first lower electrode of the first subpixel, the second lower electrode of the second subpixel, and the third lower electrode of the third subpixel is carried out. Specifically, the first lower electrode of the red subpixel, the second lower electrode of the green subpixel, and the third lower electrode of the blue subpixel are formed that respectively have conductivity and light transmitting characteristics.

Next, between the lower electrode formation process and a first charge transport layer formation process, a first charge injection layer formation process is carried out where a first charge injection layer is formed that covers the first lower electrode, the second lower electrode, and the third lower electrode. Specifically, the hole injection layer is formed that covers the first lower electrode, the second lower electrode, and the third lower electrode formed in the first subpixel to the third subpixels.

Further, the first charge transport layer formation process is carried out that includes a third charge transport layer formation process where a third charge transport layer that exists across the first subpixel (the red subpixel) and the second subpixel (the green subpixel) is formed in a lump, and a fourth charge transport layer formation process where a fourth charge transport layer that exists across the first subpixel and the third subpixel (the blue subpixel) and is on the third charge transport layer in the first subpixel is formed in a lump. Note that the first charge transport layer formation process includes a fifth charge transport layer formation process (to be carried out before the third charge transport layer formation process and the fourth charge transport layer formation process) where a fifth charge transport layer that exists across the first subpixel, the second subpixel and the third subpixel is formed in a lump.

Specifically, in the subpixels where the light emitting layers 408, 410, and 412 for emitting the first to third lights are formed, a part of the optical path length adjusting layer is also formed at the same time (S502). For example, the hole injection layer 400 having the thickness of 10 nm and the first hole transport layer 402 having the thickness of 65 nm are formed in a lump in the red subpixel for emitting red light that is the first light, the green subpixel for emitting green light that is the second light, and the blue subpixel for emitting blue light that is the third light.

Next, in the subpixels where the light emitting layers 408 and 410 that emit the first and second lights are formed, another part of the optical path length adjusting layer is also formed at the same time (S503). Specifically, the second hole transport layer 404 having a thickness of 70 nm is formed in a lump using a fine mask in the red subpixel and the green subpixel.

Next, in the subpixels where the light emitting layers 408 and 412 that emit the first and third lights are formed, still another part of the optical path length adjusting layer having a thickness different from that of the one formed in S503 process is also formed at the same time (S504). Specifically, the third hole transport layer 406 having a thickness of 35 nm is formed in a lump using a fine mask in the red subpixel and the blue subpixel.

As above, the thickness of the hole transport layers 402 and 406 in the blue subpixel, the thickness of the hole transport layers 402, 404 and 406 in the red subpixel, and the thickness of the hole transport layers 402 and 404 in the green subpixel are adjusted to be different from one another.

Subsequently, the sealing film 318 is formed, and thereafter other layers are formed (S505). Specifically, a light emitting layer formation process is carried out where the light emitting layer of the first color, the light emitting layer of the second color, and the light emitting layer of the third color are formed on the first charge transport layer. For example, the red light emitting layer 408 is, in the red subpixel, formed on the third hole transport layer 406. The green light emitting layer 410 is, in the green subpixel, formed on the second hole transport layer 404. The blue light emitting layer 412 is, in the blue subpixel, formed on the third hole transport layer 406.

Next, a second charge transport layer formation process is carried out where the second charge transport layer is formed that covers the light emitting layer of the first color, the light emitting layer of the second color, and the light emitting layer of the third color. Here, the second charge transport layer is the electron transport layer.

Next, between the second charge transport layer formation process and an upper electrode formation process, a second charge injection layer formation process is carried out where a second charge injection layer is formed on the second charge transport layer. Specifically, on the light emitting layers 408, 410, and 412, the hole block layer 414 and the electron transport layer 416 are formed in order. Note that the hole block layer 414 may be omitted.

Next, the upper electrode formation process is carried out where the upper electrode is formed on the second charge transport layer. Specifically, on the electron transport layer 416, the upper electrode 316 having conductivity, light transmitting characteristics, and reflective characteristics is formed. Further, on the upper electrode 316, the sealing film 318 is formed.

As described above, through S502 to S504 processes, for each subpixel, the optical path adjusting layer is formed that gets thicker as a wavelength of light emitted by the subpixel gets longer. By this configuration, the microcavity structure is formed where light of a wavelength that corresponds to the thickness of the optical path adjusting layer resonates between the reflective film 308 and the upper electrode 316, and the luminance of the display panel 200 improves.

Further, as described above, in the case where the optical path length adjusting layer as the one in the present embodiment is formed in the prior art, it is necessary that after forming the first hole transport layer 402 shared by all of the subpixels, the second hole transport layer 404 is formed only in the subpixels that emit light of the longest wavelength, and further the third hole transport layer 406 is formed only in the subpixels that emit light of the second longest wavelength. In this case, the material of the hole transport layer for forming the hole transport layer having the thickness of 205 nm is necessary.

Whereas, according to the present embodiment, in S503 and S504 processes, a part of the hole transport layer is formed for two subpixels at the same time. Therefore, the amount of the material of the hole transport layer consumed in S502 to S504 processes can be reduced to the amount for forming the hole transport layer having the thickness of 170 nm. Thus, in the above embodiment, as compared with the prior art, the consumption of the material of the hole transport layer for forming the hole transport layer having the thickness of 35 nm can be reduced.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A manufacturing method of an organic EL display device including a plurality of subpixels where light emitting layers that emit first to third lights whose wavelengths are different from one another are formed, comprising:
   forming a reflective film that reflects light;
   forming a lower electrode on the reflective film, the lower electrode having conductivity and light transmitting characteristics;
   a first process where, in the subpixels where the light emitting layers that emit the first and second lights are fowled, a part of an optical path length adjusting layer is formed on the lower electrode at the same time;
   a second process where, in the subpixels where the light emitting layers that emit the first and third lights are formed, another part of the optical path length adjusting layer is formed on the part of the optical path length adjusting layer at the same time so as to set its thickness different from that of the one formed in the first process; and
   forming an upper electrode having conductivity, light transmitting characteristics, and reflective characteristics, wherein the part of the optical path length adjusting layer and the another part of the optical path length adjusting layer are overlapping in a plan view, and the part of an optical path length adjusting layer and the another part of the optical path length adjusting layer are overlapping in a first subpixel emitting the first light in the plan view without overlapping in a second subpixel emitting the second light and a third subpixel emitting the third light in the plan view.

2. The manufacturing method according to claim 1, further comprising a third process where, in the subpixels where the light emitting layers that emit the first to third lights are formed, still another part of the optical path length adjusting layer is formed at the same time.

3. The manufacturing method according to claim 1, wherein a microcavity structure is formed so that light having a wavelength that corresponds to the thickness of the optical path length adjusting layer formed through the first to third processes resonates between the reflective film and the upper electrode.

4. The manufacturing method according to claim 1, wherein the optical path length adjusting layer comprises a hole transport layer.

5. The manufacturing method according to claim 1, wherein among the first to third lights, the first light has the longest wavelength, and the third light has the shortest wavelength.

6. The manufacturing method according to claim 1, wherein in the first to third processes, the optical path length adjusting layer is formed using a fine mask.

7. A manufacturing method of an organic EL display device including a first subpixel that is provided with a light emitting layer of a first color, a second subpixel that is adjacent to the first subpixel and is provided with a light emitting layer of a second color, and a third subpixel that is adjacent to the first subpixel on a side of the first subpixel opposite to a side where the second subpixel is located and is provided with a light emitting layer of a third color, comprising:

a lower electrode formation process where a first lower electrode of the first subpixel, a second lower electrode of the second subpixel, and a third lower electrode of the third subpixel are formed;

a first charge transport layer formation process where a first charge transport layer is formed on the first lower electrode, the second lower electrode, and the third lower electrode;

a light emitting layer formation process where the light emitting layer of the first color, the light emitting layer of the second color, and the light emitting layer of the third color are formed on the first charge transport layer;

a second charge transport layer formation process where a second charge transport layer is formed that covers the light emitting layer of the first color, the light emitting layer of the second color, and the light emitting layer of the third color; and an upper electrode formation process where an upper electrode is formed on the second charge transport layer, wherein the first charge transport layer formation process comprises a third charge transport layer formation process where a third charge transport layer that exists across the first subpixel and the second subpixel is formed in a lump, and a fourth charge transport layer formation process where a fourth charge transport layer that exists across the first subpixel and the third subpixel and is on the third charge transport layer in the first subpixel is formed in a lump to partially overlap with the third charge transport layer in a plan view, and wherein the third charge transport layer and the fourth charge transport layer are located without overlapping in the second subpixel and the third subpixel in the plan view.

8. The manufacturing method of the organic EL display device according to claim 7, wherein a thickness of the third charge transport layer is different from a thickness of the fourth charge transport layer.

9. The manufacturing method of the organic EL display device according to claim 7, wherein the first charge transport layer, the third charge transport layer, and the fourth charge transport layer are hole transport layers, and wherein the second charge transport layer is an electron transport layer.

10. The manufacturing method of the organic EL display device according to claim 7, wherein the first charge transport layer formation process comprises a fifth charge transport layer formation process (to be carried out before the third charge transport layer formation process and the fourth charge transport layer formation process) where a fifth charge transport layer that exists across the first subpixel, the second subpixel, and the third subpixel is formed in a lump.

11. The manufacturing method of the organic EL display device according to claim 10, wherein the fifth charge transport layer is a hole transport layer.

12. The manufacturing method of the organic EL display device according to claim 7, further comprising:

a first charge injection layer formation process where a first charge injection layer is formed that covers the first lower electrode, the second lower electrode, and the third lower electrode, between the lower electrode formation process and the first charge transport layer formation process; and a second charge injection layer formation process where a second charge injection layer is formed on the second charge transport layer, between the second charge transport layer formation process and the upper electrode formation process.

13. The manufacturing method of the organic EL display device according to claim 7, wherein a thickness of the first charge transport layer in the first subpixel, a thickness of the first charge transport layer in the second subpixel, and a thickness of the first charge transport layer in the third subpixel are different from one another.

14. The manufacturing method of the organic EL display device according to claim 7, further comprising a reflective electrode formation process where a first reflective electrode, a second reflective electrode, and a third reflective electrode are formed before the lower electrode formation process, wherein the first lower electrode is in direct contact with the first reflective electrode, wherein the second lower electrode is in direct contact with the second reflective electrode, and wherein the third lower electrode is in direct contact with the third reflective electrode.

* * * * *